(12) United States Patent
Dreeskornfeld et al.

(10) Patent No.: US 7,692,246 B2
(45) Date of Patent: Apr. 6, 2010

(54) PRODUCTION METHOD FOR A FINFET TRANSISTOR ARRANGEMENT, AND CORRESPONDING FINFET TRANSISTOR ARRANGEMENT

(75) Inventors: Lars Dreeskornfeld, Dresden (DE); Franz Hofmann, Munich (DE); Johannes Richard Luyken, Munich (DE); Michael Specht, Munich (DE)

(73) Assignee: Infineon Technologies AG, Munich (DE)

( * ) Notice: Subject to any disclaimer, the term of this patent is extended or adjusted under 35 U.S.C. 154(b) by 450 days.

(21) Appl. No.: 11/649,470

(22) Filed: Jan. 4, 2007

(65) Prior Publication Data

US 2007/0158756 A1 Jul. 12, 2007

(30) Foreign Application Priority Data

Jan. 12, 2006 (DE) .................. 10 2006 001 680

(51) Int. Cl.
*H01L 27/01* (2006.01)
(52) U.S. Cl. .................. 257/353; 257/374; 257/618; 257/E29.275; 257/E29.137
(58) Field of Classification Search ............. 257/353, 257/374, 618, E29.275, E29.137
See application file for complete search history.

(56) References Cited

U.S. PATENT DOCUMENTS

2004/0262687 A1 12/2004 Jung et al.

2005/0227435 A1* 10/2005 Oh et al. .................. 438/257
2005/0260814 A1* 11/2005 Cho et al. ................. 438/257

FOREIGN PATENT DOCUMENTS

| EP | 1202335 A2 | 2/2002 |
|---|---|---|
| WO | WO 2004 068589 A1 | 12/2004 |
| WO | WO 2005/098963 | 10/2005 |

OTHER PUBLICATIONS

German Office Action dated Nov. 2, 2006.

* cited by examiner

*Primary Examiner*—Tu-Tu V Ho
(74) *Attorney, Agent, or Firm*—Jenkins, Wilson, Taylor & Hunt, P.A.

(57) ABSTRACT

The present invention provides a FinFET transistor arrangement produced using a method with the steps: providing a substrate (106, 108); forming an active region (1) on the substrate a fin-like channel region (113b'; 113b''). Formation of the fin-like channel region (113b'; 113b'') has the following steps: forming a hard mask (S1-S4) on the active region (1); anisotropic etching of the active region (1) using the hard mask (S1-S4) forming STI trenches (G1-G5) having an STI oxide filling (9); polishing-back of the STI oxide filling (9); etching-back of the polished-back STI oxide filling (9); selective removal of components of the hard mask forming a modified hard mask (S1'-S4'); anisotropic etching of the active region (1) using the modified hard mask (S1'-S4') forming widened STI trenches (G1'-G5'), the fin-like channel regions (113b'; 113b'') of the active region (1) remaining for each individual FinFET transistor.

1 Claim, 17 Drawing Sheets

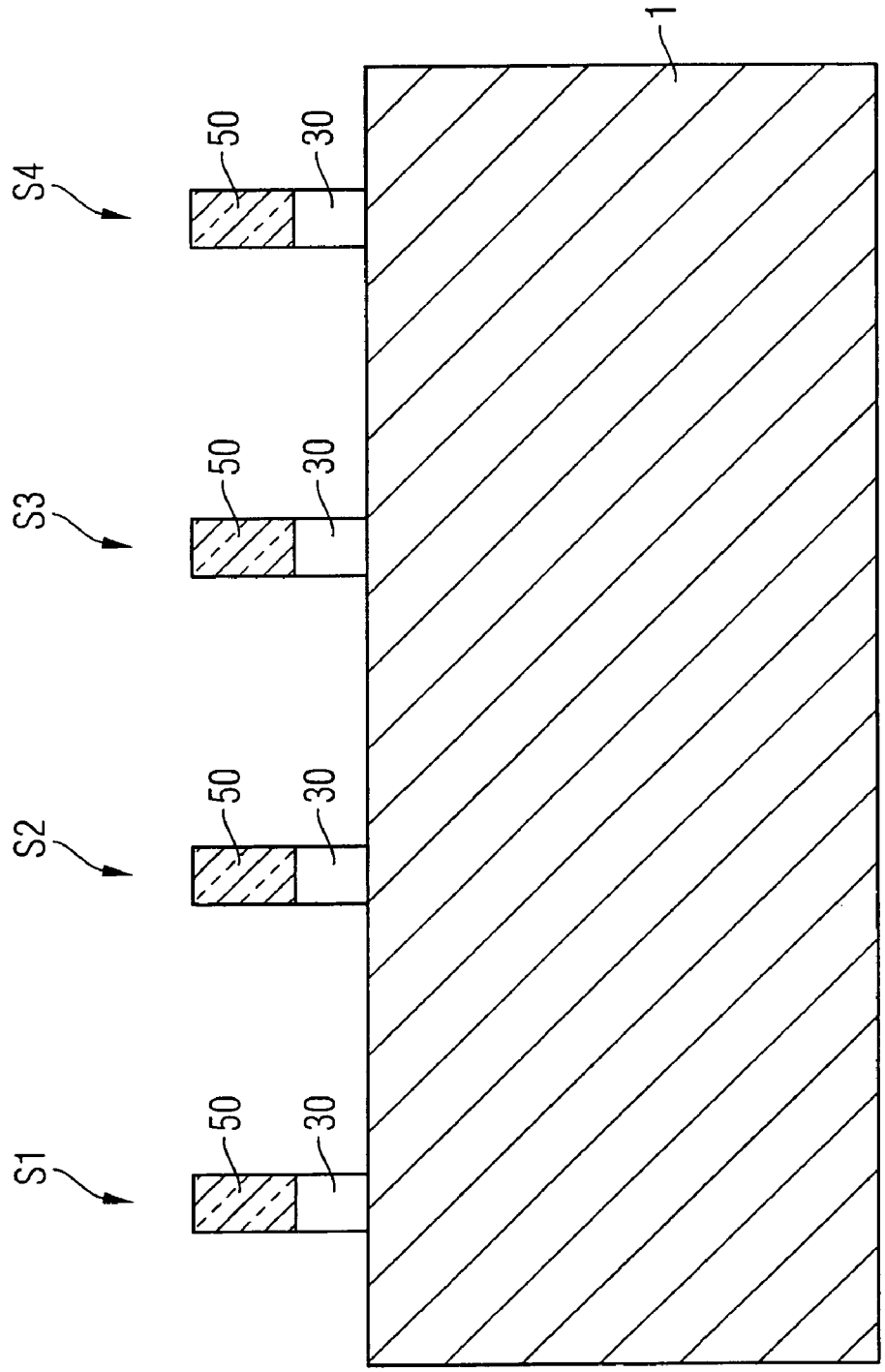

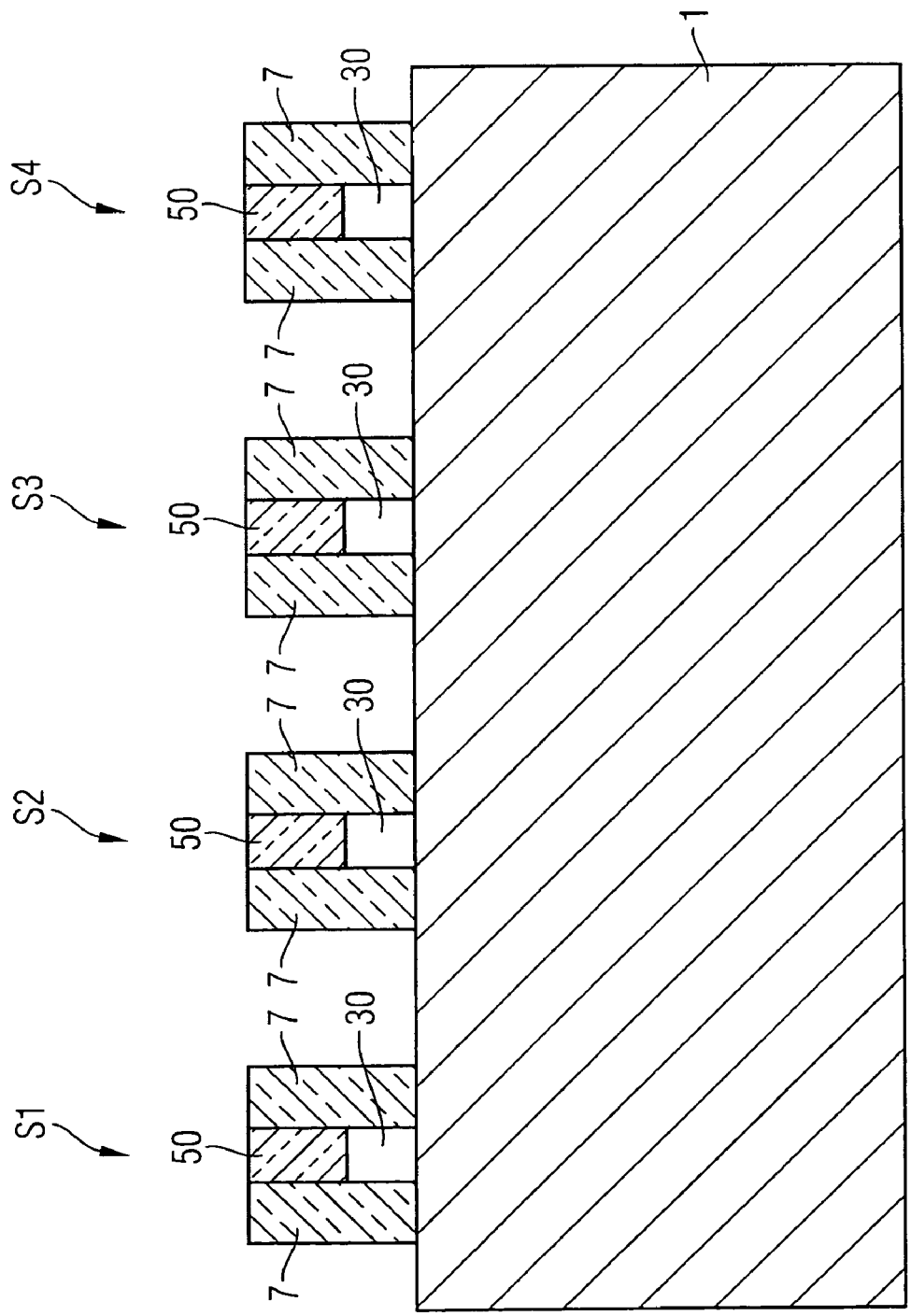

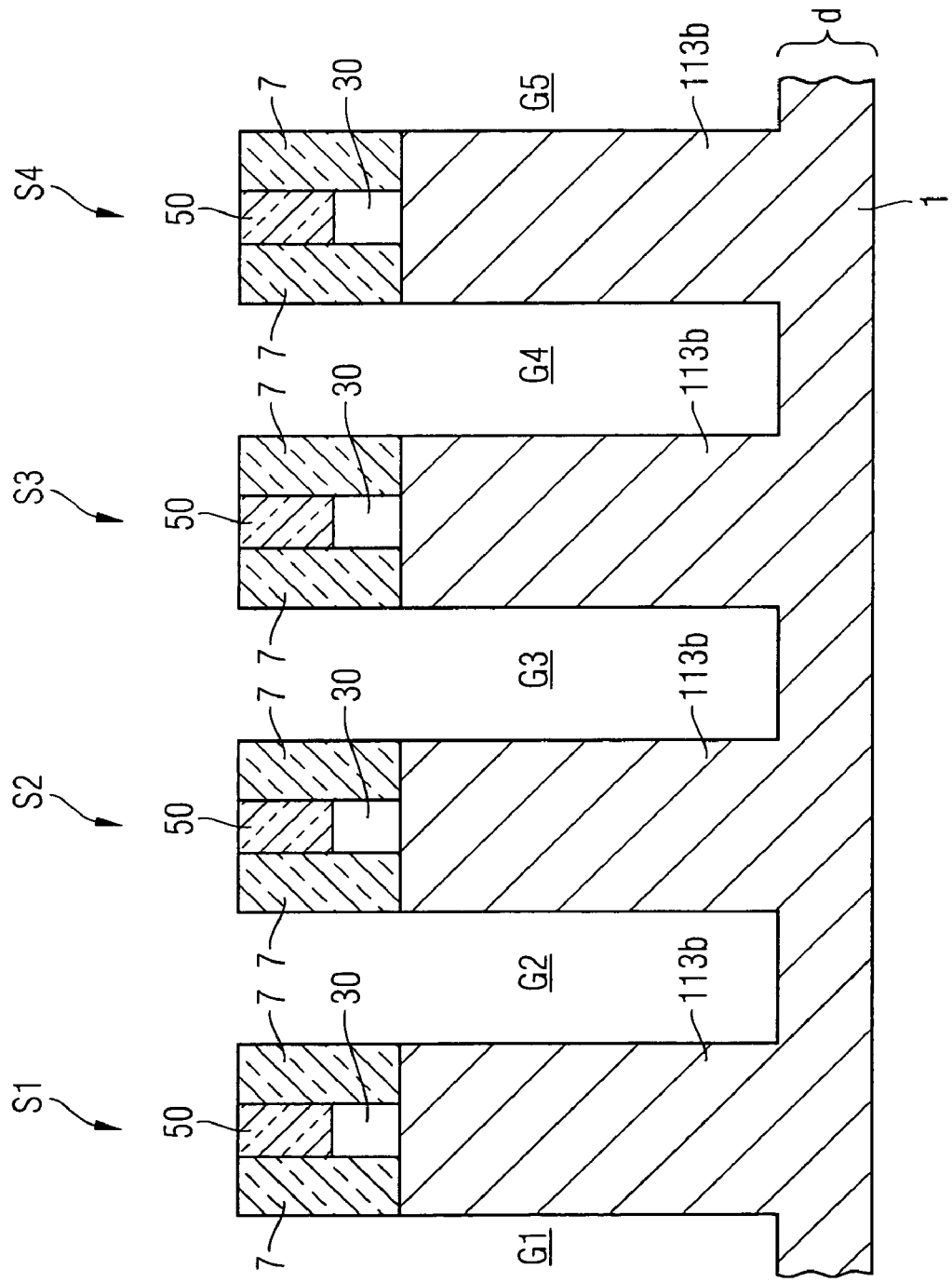

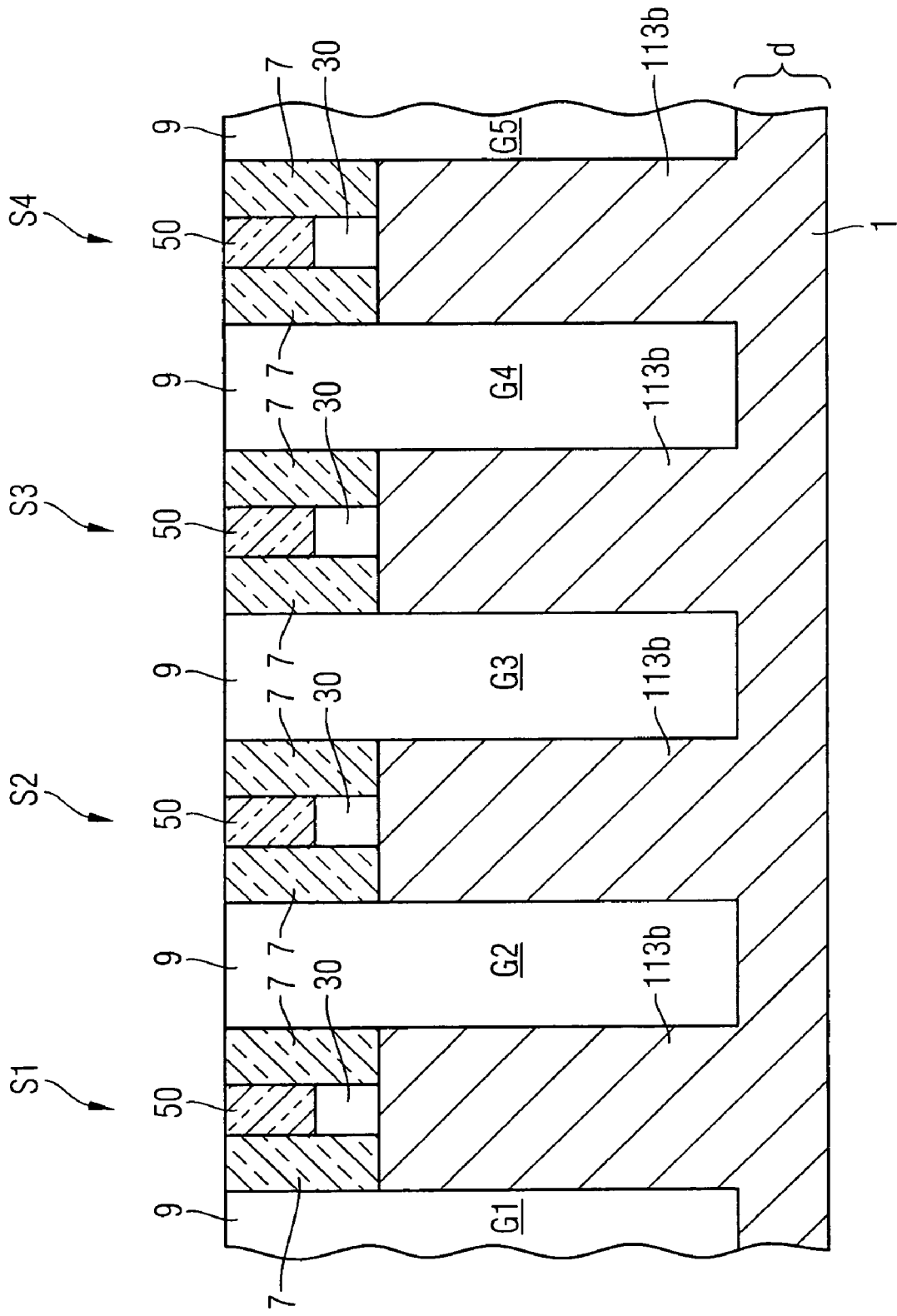

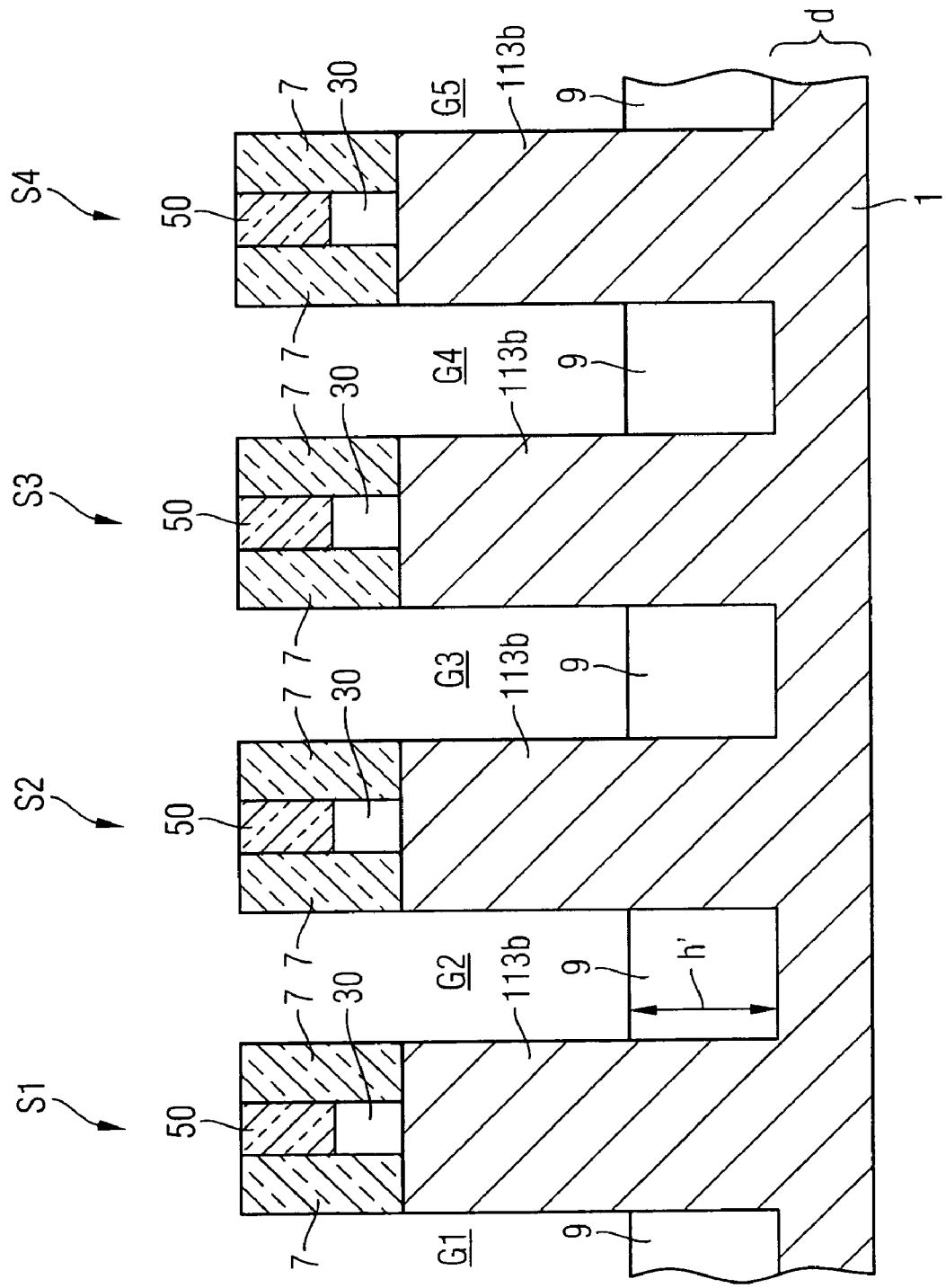

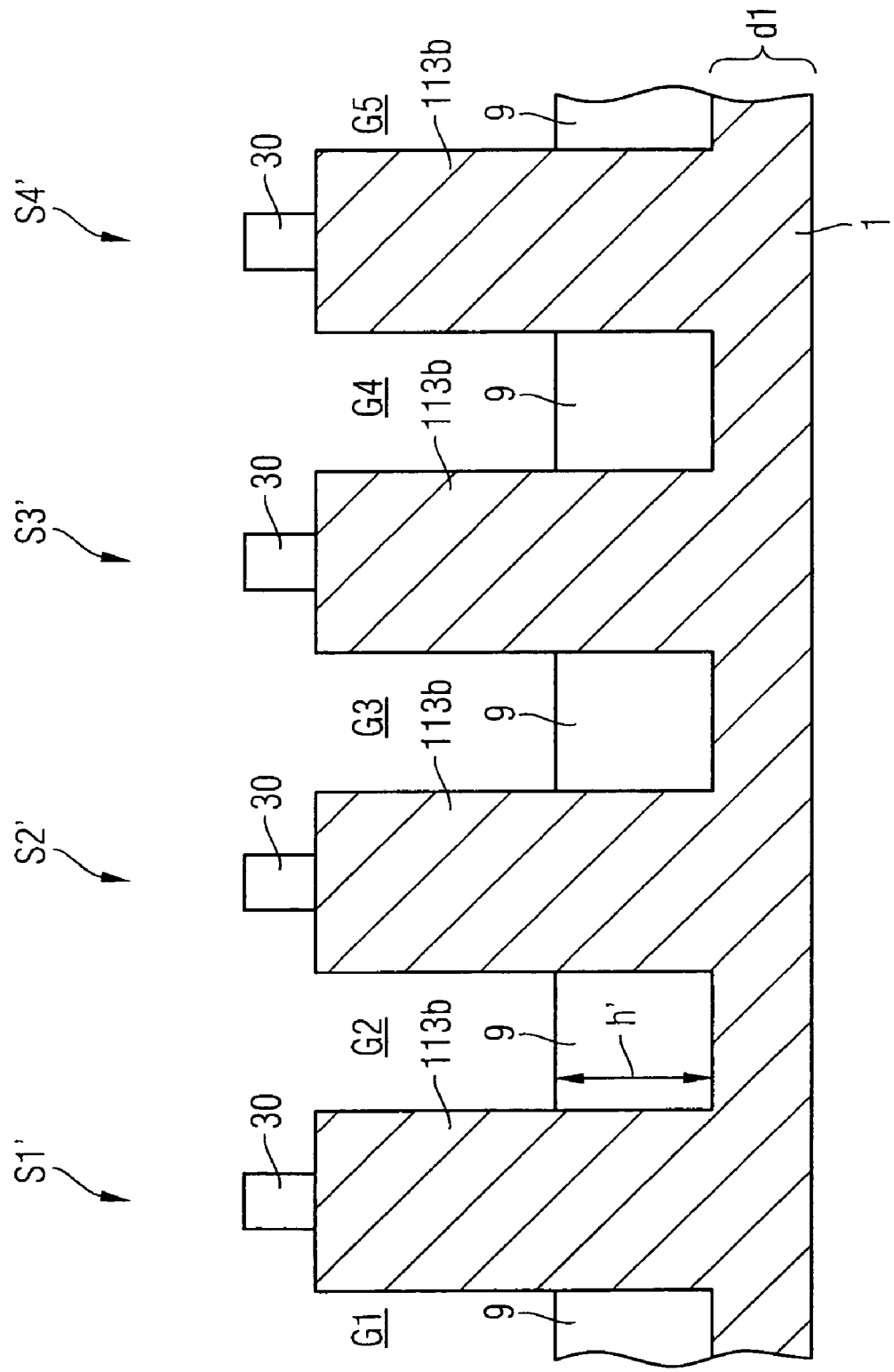

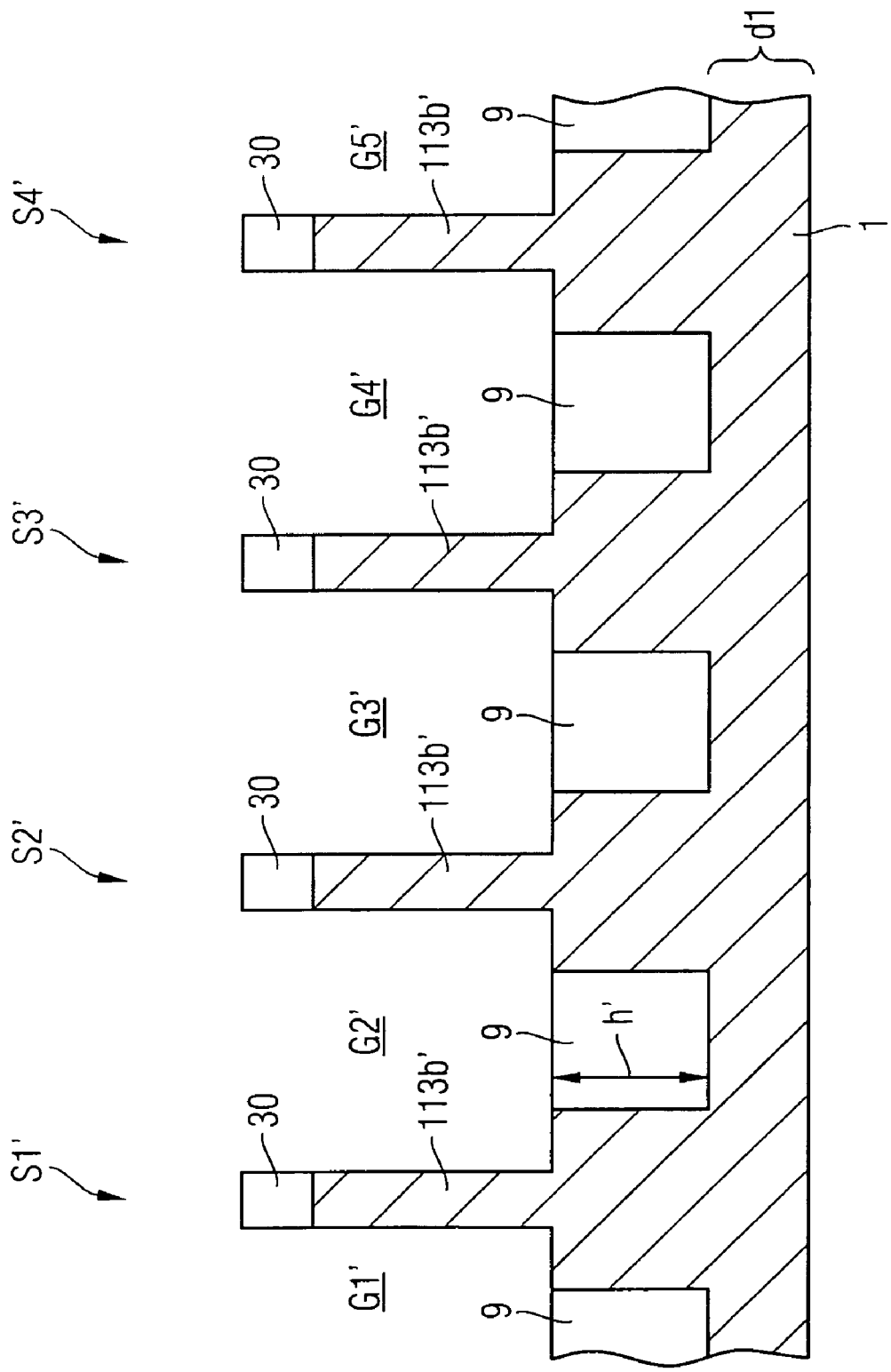

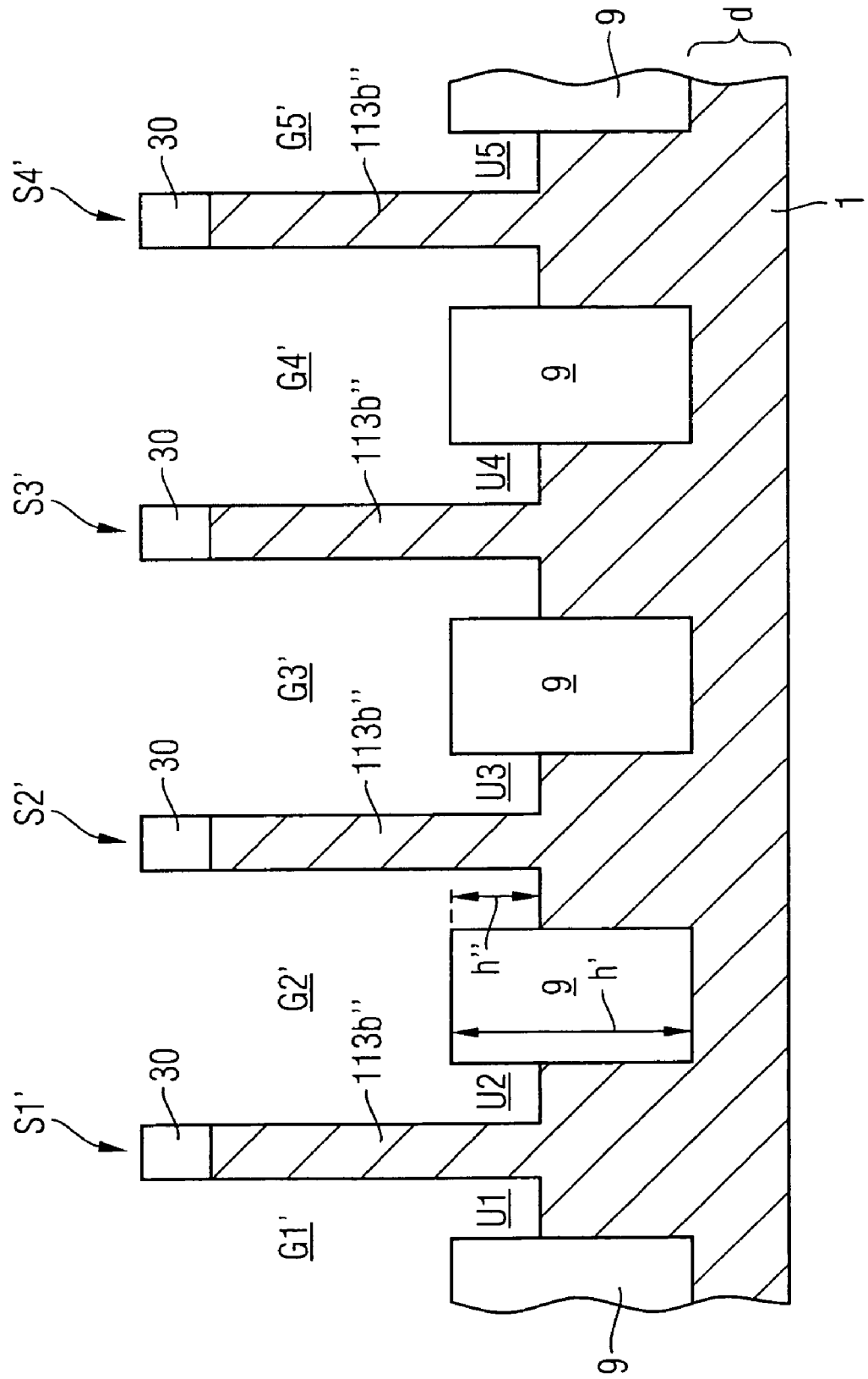

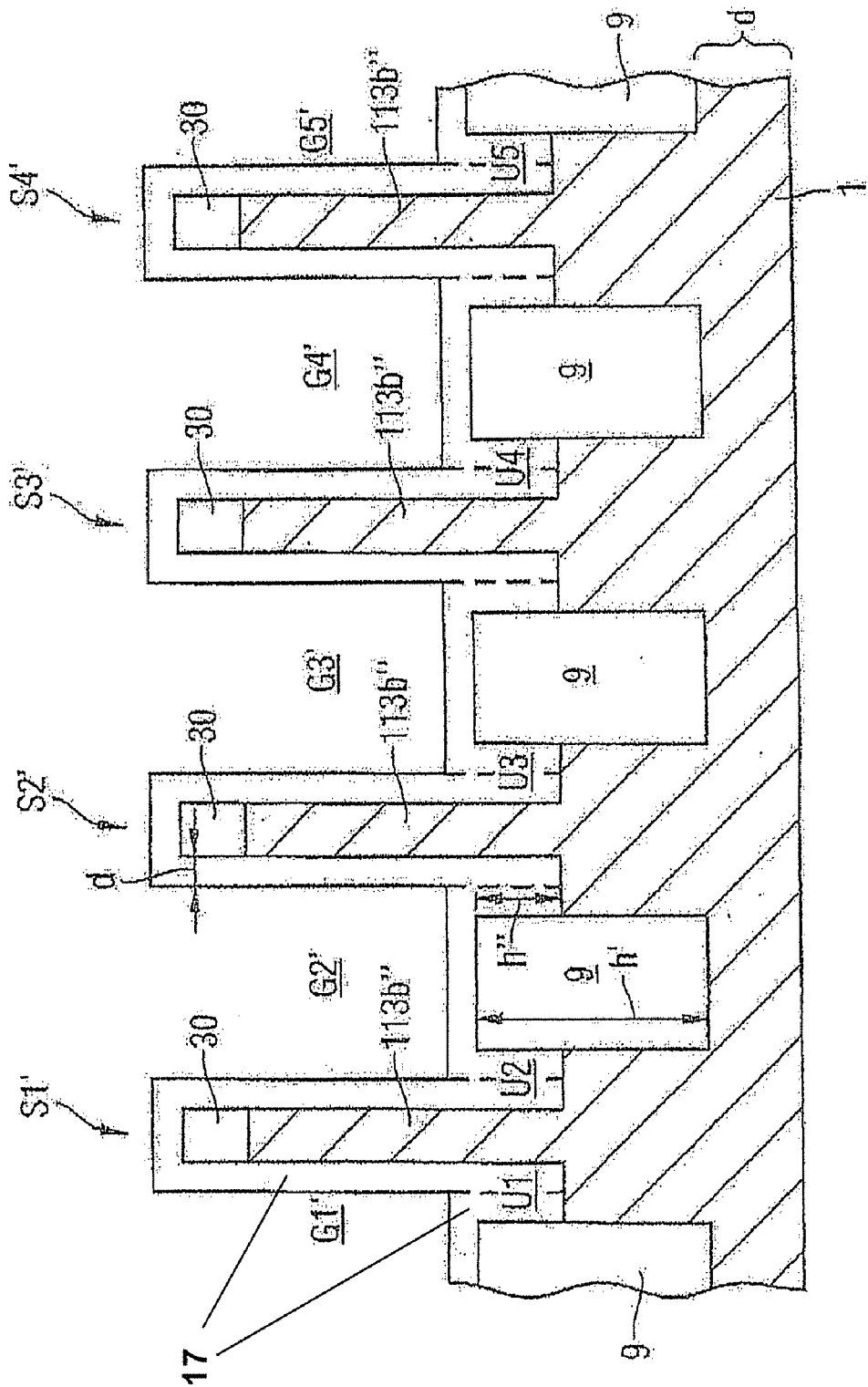

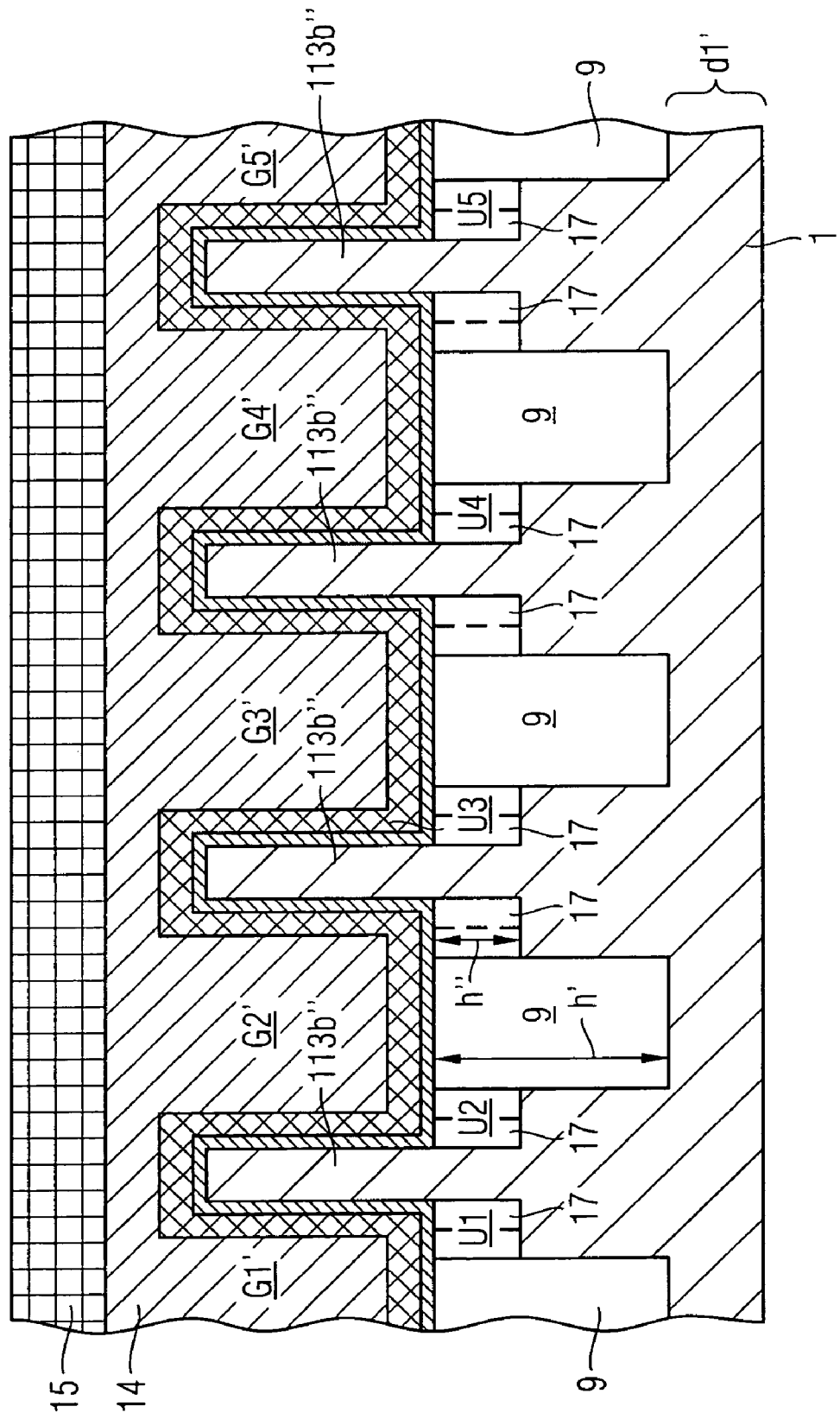

_US 7,692,246 B2_

PRODUCTION METHOD FOR A FINFET TRANSISTOR ARRANGEMENT, AND CORRESPONDING FINFET TRANSISTOR ARRANGEMENT

The present invention relates to a production method for a FinFET transistor arrangement, and a corresponding FinFET transistor arrangement.

Although applicable to any integrated circuits, in principle, the present invention and also the problems on which it is based will be explained with regard to integrated memory circuits using silicon technology with FinFET transistors.

FinFET transistors (fin field-effect transistors) have a channel region in the form of a fin at which a gate with a corresponding gate electrode is provided on a plurality of sides. An arrangement of this type enables a double gate structure with improved short-channel effects and transistors having gate lengths of the order of magnitude of 10 to 30 nm. FinFET transistors of this type have recently been used to an increased extent in integrated memory circuits using silicon technology.

Figure 3A:
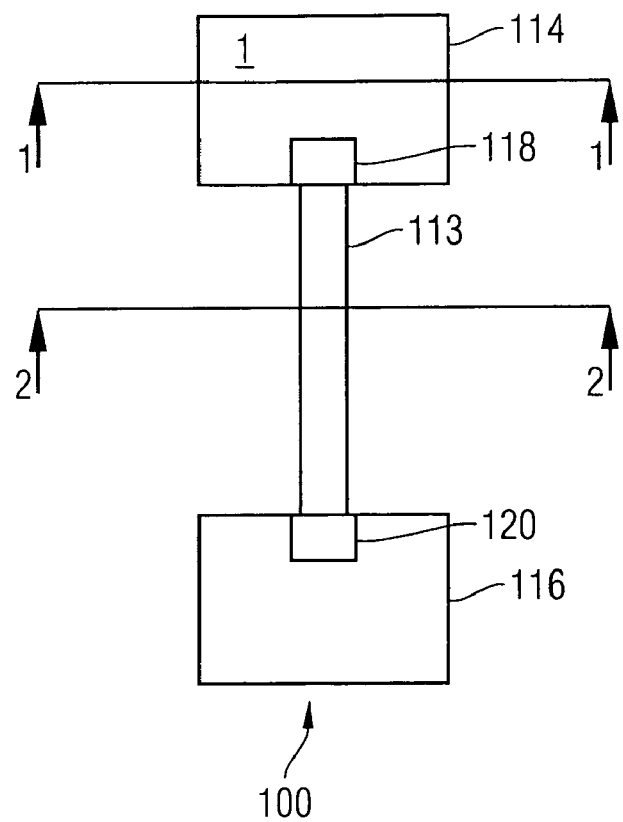
Figure 3B:
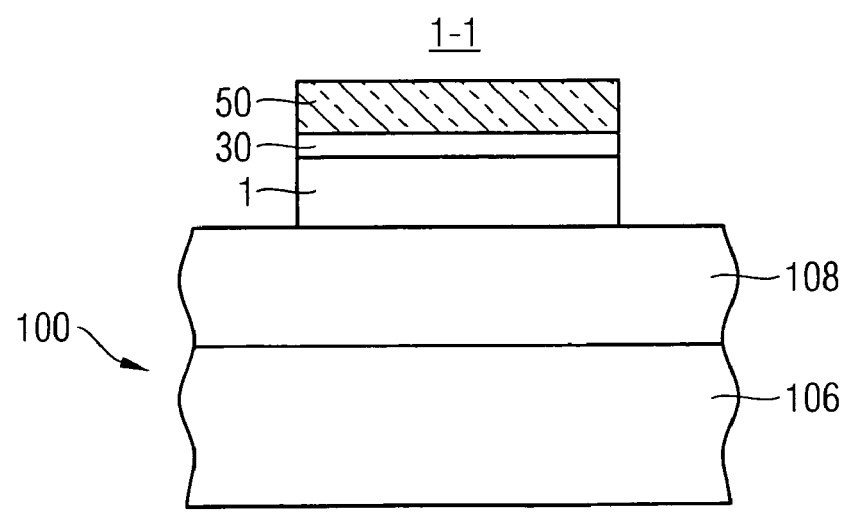
Figure 3C:
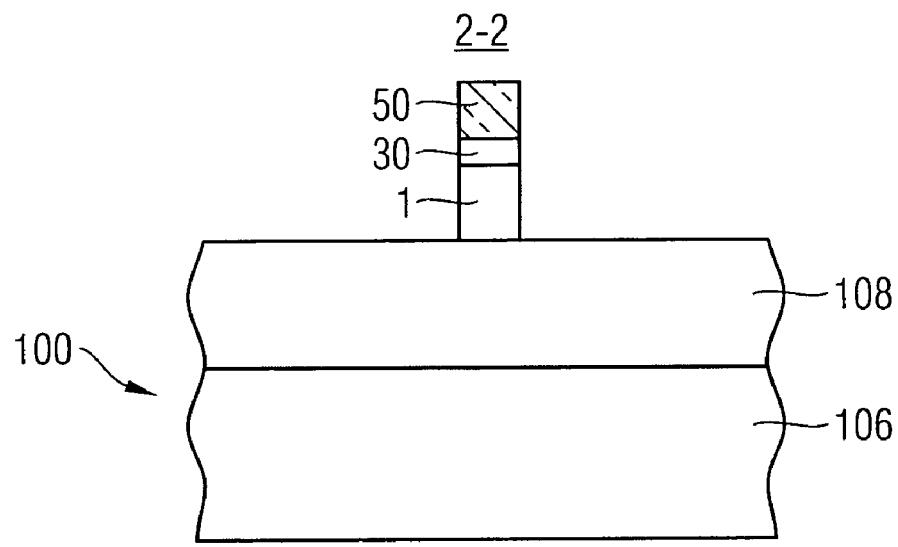

FIGS. 3a-c are schematic illustrations of a FinFET transistor known from EP 1 202 335 A2, FIG. 3a being a top view and FIGS. 3b,c being cross sections along the lines 1-1 and 2-2, respectively, from FIG. 3a.

FIG. 3a shows a top view of an SOI substrate (SOI=silicon-on-insulator) 100. The SOI substrate 100 comprises a carrier substrate 106 in the form of a silicon wafer and also an oxide layer 108 provided thereon and an active silicon layer 1. In accordance with the illustration of FIGS. 3b,c, a hard mask structure comprising a pad oxide layer 30 and a pad nitride layer 50 situated over the latter is provided on the active silicon layer 1. The pad oxide layer 30 and the pad nitride layer 50 have a thickness of typically 30 to 120 nm and define etching regions for the formation of STI trenches (STI=shallow trench isolation) which isolate the FinFET transistors from one another and from other components.

The active silicon layer 1 is patterned with the aid of the hard mask comprising the pad oxide layer 30 and the pad nitride layer 50 in such a way that it forms an elongate narrow channel region 113 between two rectangular source and drain regions 114, 116. Reference symbols 118, 120 designate contact regions for the source region 114 and the drain region 116, respectively. The process state shown in FIGS. 3a-c corresponds to a state with uncovered channel region 113, over which a gate dielectric and gate structure is yet to be formed along the direction 2-2 in FIG. 3a, for which various possibilities are suitable in accordance with the prior art.

Figure 3D:
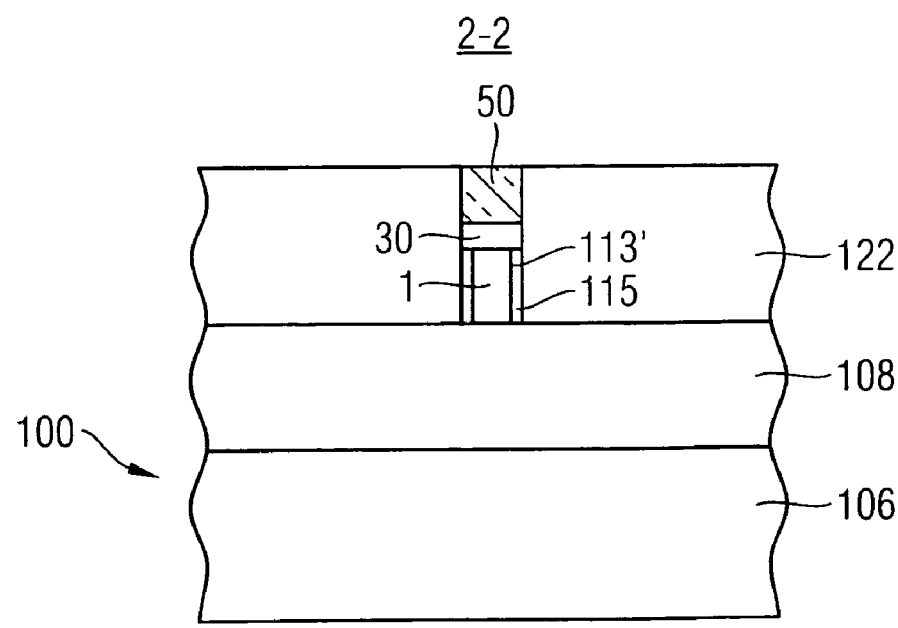

FIG. 3d is a schematic illustration of a possible fin and gate structure for the FinFET transistor known from EP 1 202 335 A2 proceeding from FIG. 3c, as can be gathered from WO 2004/068589.

In the case of the process variant in accordance with FIG. 3d, which is known from WO 2004/068589 A1, firstly an STI oxide (not shown) is deposited, and is removed in direction 2-2 of FIG. 3a along the gate structures to be provided. The channel region 113 (also designated as fin region) is subsequently thinned by means of an isotropic silicon etch, which leads to a thinned channel region 113'. Afterwards, a gate dielectric 115 is provided on the active silicon layer 1 of the thinned channel region 113'. Finally, an elongate gate region 122 is provided over the gate dielectric 115 along the direction 2-2 of FIG. 3a, after which the relevant FinFET transistor is completed.

In the case of the variant in accordance with FIG. 3d, it is disadvantageous that fluctuations of the width of the fin-like channel regions 113' occur after the isotropic thinning.

Figure 4A:
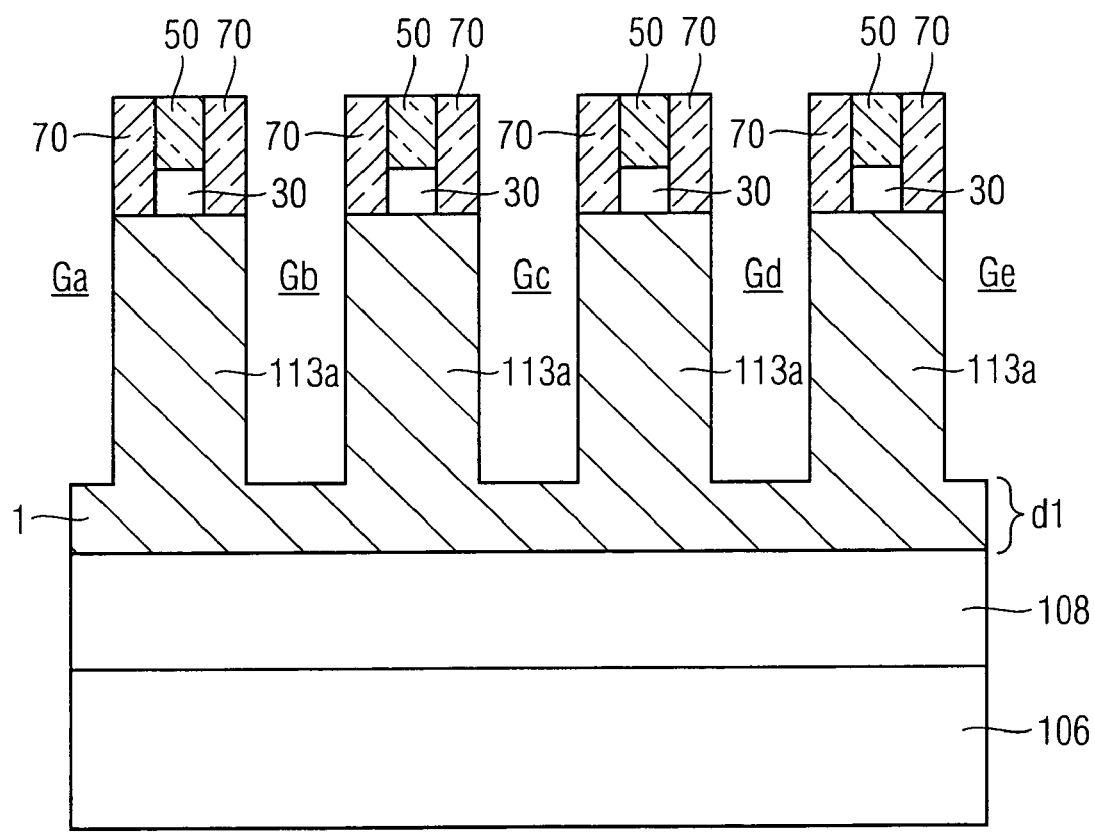

FIGS. 4a,b are two schematic illustrations of two exemplary fin structures of a FinFET transistor arrangement comprising the FinFET transistors known from EP 1 202 335 A2.

In the case of the variants shown in FIGS. 4a,b, a sublithographic hard mask is formed on the active silicon layer 1, said hard mask having the pad oxide layer 30, the pad nitride layer 50 and, in the case of the variant in accordance with FIG. 4a, sidewall spacers 70 composed of silicon nitride and provided laterally with respect thereto.

In the case of the variants in accordance with FIGS. 4a,b, firstly STI trenches Ga, Gb, Gc, Gd, Ge are etched, which define fin-like channel regions 113a and 113a', respectively, where the active silicon layer 1 remains. In the case of these variants, moreover, in contrast to the variant in accordance with FIGS. 3a-c, the active silicon layer 1 is not etched through completely, rather a residual thickness d1 of the active silicon layer 1 remains.

The disadvantage of the variant in accordance with FIG. 4a is that the fin-like channel regions 113a are relatively wide.

Figure 4B:
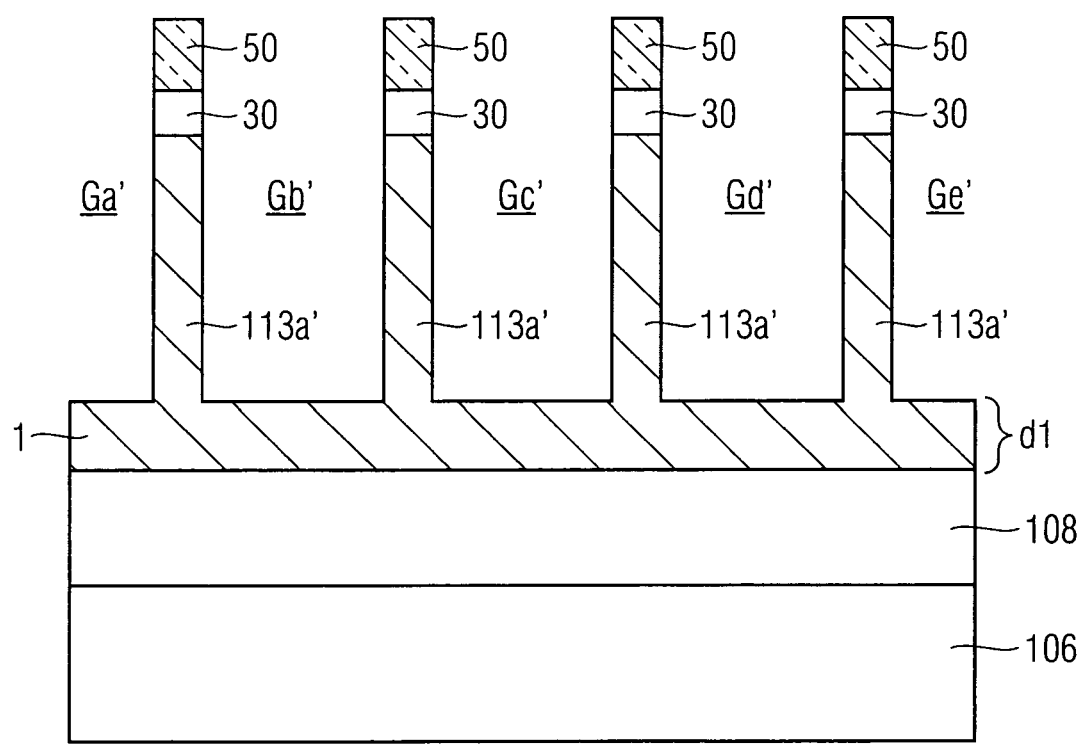

The disadvantage of the variant in accordance with FIG. 4b is that after the anisotropic etch of the active silicon layer 1 and after the filling of the widened STI trenches Ga'-Ge', only very little of the pad nitride layer 50 is still available as a CMP stop. (CMP=chemical mechanical polishing), which leads to considerable problems in the planarization of the STI oxide (not shown).

The object on which the present invention is based is to provide an improved production method for a FinFET transistor arrangement, and a corresponding FinFET transistor arrangement, having an excellent scalability and a robust production method.

In accordance with the present invention, this object is achieved by means of the production method according to Claim 1 and, respectively, the corresponding FinFET transistor arrangement in accordance with Claim 8.

What is particularly advantageous about the subject matter of the invention is the fact that enough nitride can remain for the CMP step and the fin-like channel regions can nevertheless be made very narrow.

Advantageous developments and improvements of the production method according to Claim 1 and, respectively, the corresponding FinFET transistor arrangement according to Claim 8 are found in the dependent claims.

In accordance with one preferred embodiment, the anisotropic etching of the active layer using the modified hard mask is effected as far as the residual height of the etched-back STI oxide filling.

In accordance with a further preferred embodiment, the anisotropic etching of the active layer using the modified hard mask is effected as far as below the residual height of the etched-back STI oxide filling, with the result that a respective gap region arises between the fin-like channel region and the etched-back STI oxide filling, and that the respective gap region is filled with an insulation layer prior to the formation of the gate dielectric and the gate region. It is thus possible to avoid parasitic transistors at the base of the fin-like channel regions.

In accordance with a further preferred embodiment, the filling of the respective gap region is effected by deposition and anisotropic etching-back of an oxide layer with a thickness of approximately half the width of the gap regions.

In accordance with a further preferred embodiment, the modified hard mask is removed prior to the formation of the gate dielectric and the gate region over the fin-like channel region.

In accordance with a further preferred embodiment, the following steps are carried out for the formation of the gate dielectric and the gate region over the fin-like channel region: deposition of the gate dielectric, deposition of a TaN layer over the gate dielectric, and filling of the modified STI trenches with a polysilicon filling.

In accordance with a further preferred embodiment, the polysilicon filling (14) is planarized and a metal silicide layer (15) is deposited over it.

Preferred embodiments of the invention are illustrated in the drawings and are explained in the description below.

In the figures:

FIGS. 1a-i show schematic cross sections along the line 2-2 from FIG. 3a of a production method for a FinFET transistor arrangement and of a corresponding FinFET transistor arrangement as a first embodiment of the present invention;

FIGS. 2a-d show schematic cross sections along the line 2-2 from FIG. 3a of a production method for a FinFET transistor arrangement and of a corresponding FinFET transistor arrangement as a second embodiment of the present invention;

FIGS. 3a-c show schematic illustrations of a FinFET transistor known from EP 1 202 335 A2, FIG. 3a being a top view and FIGS. 3b,c being cross sections along the lines 1-1 and 2-2, respectively, from FIG. 3a;

FIG. 3d shows a schematic illustration of a possible fin and gate structure for the FinFET transistor known from EP 1 202 335 A2, proceeding from FIG. 3c, as can be gathered from WO 2004/068589; and FIGS. 4a,b show a schematic illustration of an exemplary fin structure of a FinFET transistor arrangement comprising the FinFET transistors known from EP 1 202 335 A2.

In the figures, identical reference symbols designate identical or functionally equivalent components.

FIG. 1a-i are schematic cross sections along the line 2-2 from FIG. 3a of a production method for a FinFET transistor arrangement and of a corresponding FinFET transistor arrangement as a first embodiment of the present invention.

Only the cross section in direction 2-2 from FIG. 3a is illustrated in the description of the embodiments in accordance with FIGS. 1a-i and FIGS. 2a-d. The rest of the known process steps for producing the source and drain regions 114, 116 and also the carrier substrate 106 and the oxide layer 108 are omitted in the relevant illustrations for the purpose of simplification. In this connection, reference is made to the entire scope of the illustration in accordance with FIGS. 3a-c.

Figure 1A:
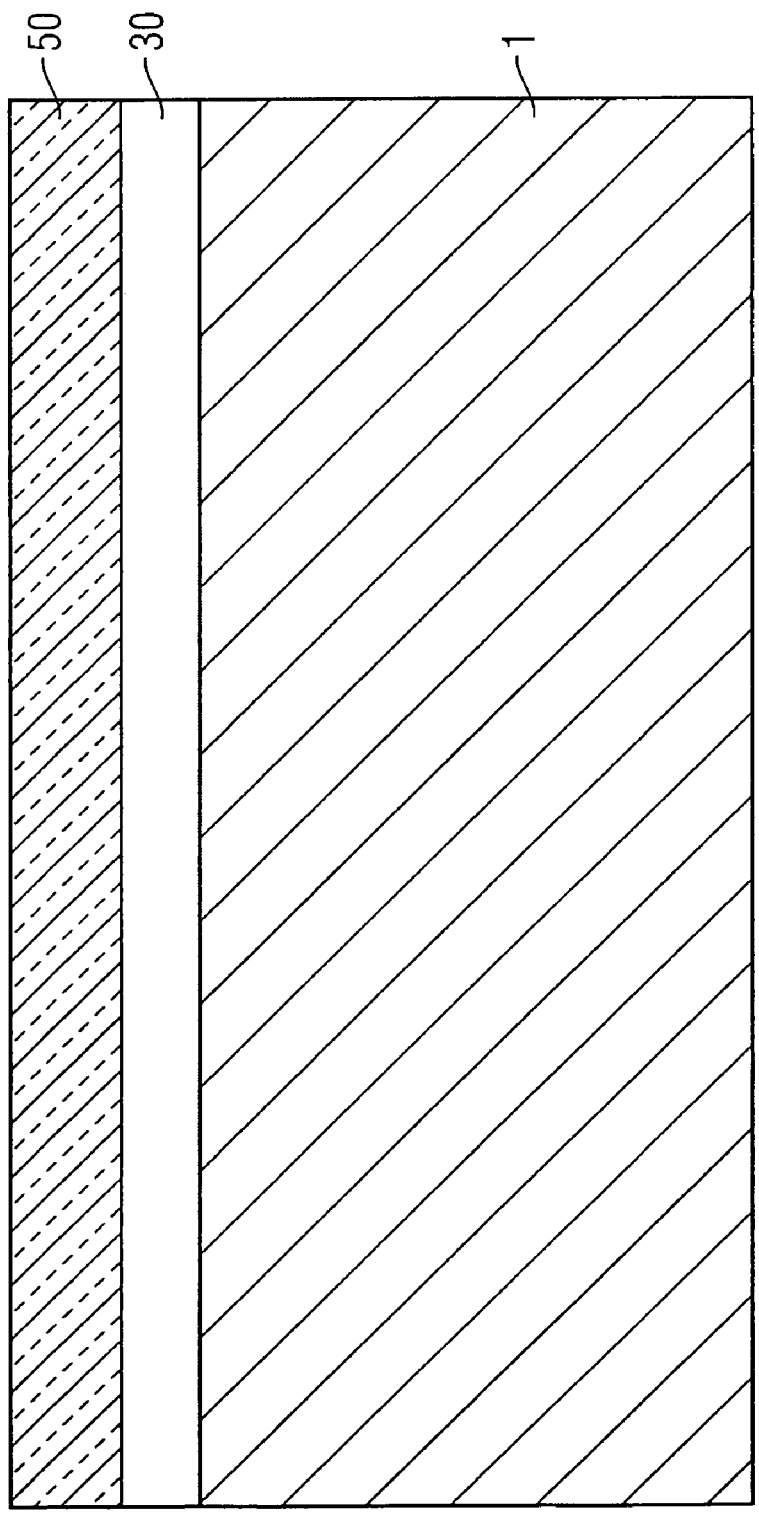

FIG. 1a shows the active silicon layer 1 with the pad oxide layer 30 situated thereon and the overlying pad nitride layer 50. This is followed, referring to FIG. 1b, by a patterning of the pad oxide layer 30 and the pad nitride layer 50 to form a hard mask with hard mask regions S1, S2, S3, S4 corresponding to the later position of the fin-like channel regions using customary photolithographic technology.

At the hard mask regions S1-S4, in accordance with FIG. 1c, nitride spacers 7 are provided on both sides by deposition and anisotropic etching-back of a silicon nitride layer.

Afterwards, in accordance with FIG. 1d, STI trenches G1-G5 are etched in the active silicon layer 1 using the hard mask regions S1-S4, which define fin-like regions 113b as precursors of the later channel regions in the remaining active silicon layer 1.

Afterwards, the STI trenches G1-G5 are filled with an STI oxide filling 9, after which the STI oxide filling 9 is polished back as far as the top side as the hard mask regions S1-S4. On account of the hard mask regions S1-S4 widened by the sidewall spacers 7, in the cell array shown there is an area ratio of STI oxide filling 9 to hard mask regions S1-S4 of 1:1, which means that enough nitride is available for stopping the CMP process. This leads to the process state in accordance with FIG. 1e.

Referring further to FIG. 1f, the STI oxide filling 9 is then etched back down to a residual height h' with respect to the bottoms of the STI trenches G1-G5.

Then, in accordance with FIG. 1g, that part of the hard mask regions S1-S4 which comprises the pad nitride layer 50 is removed selectively with respect to the pad oxide layer 30, with respect to the active silicon substrate 1 and with respect to the STI oxide filling 9 by means of a corresponding selective etch, for example a wet-chemical etch. Narrowed hard mask regions S1'-S4' remain which are composed only of the pad oxide layer 30.

As illustrated in FIG. 1h, this is followed by an anisotropic silicon etch using the narrowed hard mask regions S1'-S4' as a mask, which reaches in the depth as far as the height h' of the etched-back STI oxide filling 9. The thinned fin-like channel regions 113b' remain, a respective region with an STI oxide filling 9 being provided between adjacent fin-like channel regions 113b' in the active silicon substrate 1. In this case, the STI oxide filling 9 prevents the silicon between the fin-like channel regions 113b' from being etched away even more deeply in the course of the silicon etch in accordance with FIG. 1h.

Figure 1I:
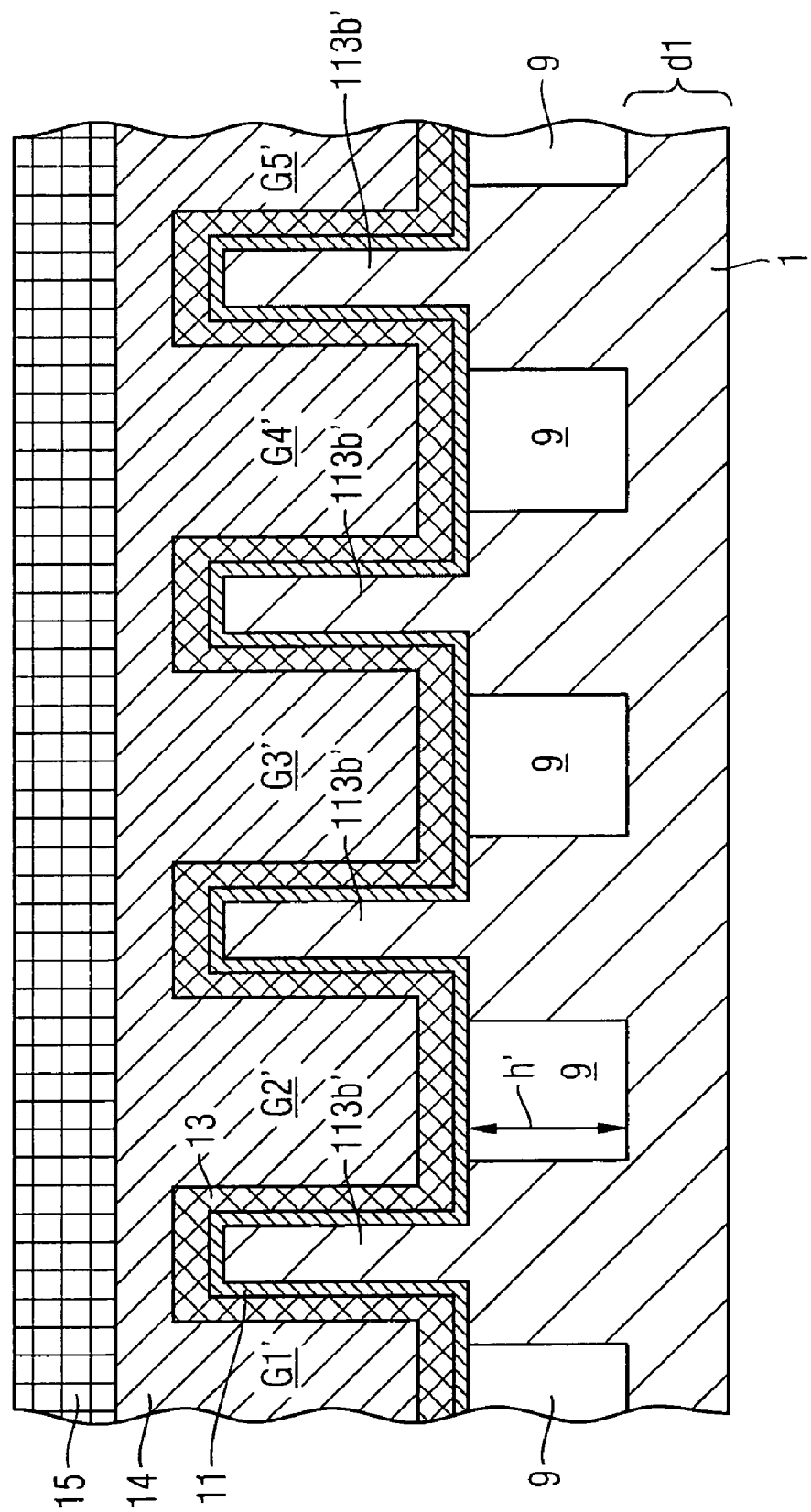

In a concluding process step sequence, which is illustrated in FIG. 1i, the remaining hard mask regions S1'-S4' composed of the pad oxide layer 30 are removed and an ONO dielectric layer 11 is then deposited. Afterwards, a TaN layer 13 is deposited over the resulting structure. The upper regions of the trenches G1'-G5' are then filled with a polysilicon layer 14, which is subsequently planarized by means of a CMP process. Finally, a tungsten-silicon layer 50 is deposited over the planar structure. A photolithography step (not shown) is effected for the definition of gate interconnects running in direction 2-2 form FIG. 3a. Finally, the superfluous regions of the layers 11, 13, 14, 15 are removed using the photoresist mask, not shown, and the photoresist is stripped, which leads to the state in accordance with FIG. 1i. In the course of the pad oxide etch, the STI oxide filling is slightly incipiently etched in the process, but this is insignificant in the case of a thin pad oxide layer 30. If the small steps that arise from this are disturbing, the silicon etch could be carried out with a corresponding bias as far as below the top side of the STI oxide filling 9 (cf. the second embodiment explained below).

FIGS. 2a-d are schematic cross sections along the line 2-2 from FIG. 3a of a production method for a FinFET transistor arrangement, and of a corresponding FinFET transistor arrangement as a second embodiment of the present invention.

The process sequence of the second embodiment in accordance with FIGS. 2a-d follows the process state in accordance with FIG. 1h. In contrast to the process state in accordance with FIG. 1h, in accordance with FIG. 2a, the anisotropic silicon etch is continued as far as below the height h' of the remaining STI oxide filling 9. This produces gap regions U1-U5 surrounding the remaining STI oxide filling 9. This has the particular effect that there is no longer any parasitic transistor present at the base point of the thinned fin-like channel region 113b''. The gap regions U1-U5 have a height h'' in this case.

Figure 2C:
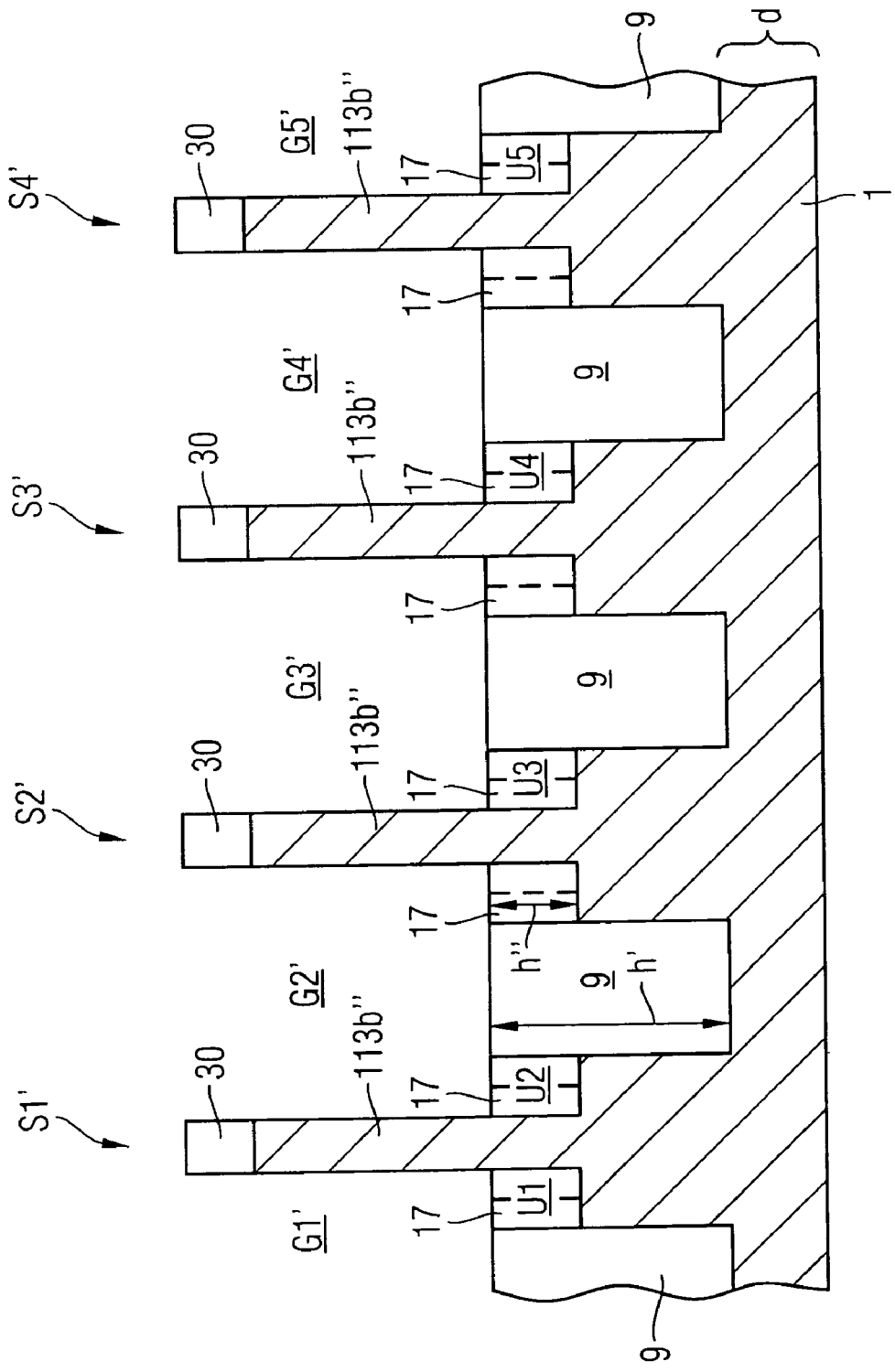

Referring further to FIG. 2b, a thin oxide layer 17 is deposited, where the thickness d corresponds approximately to half the width of the gap regions U1-U5, as indicated by the dashed line in the gap regions U1-U5 in FIG. 2b. This is followed by a wet-chemical etching-back of the thin oxide layer 17 in such a way that the latter remains only in the gap regions U1-U5, as can be seen from FIG. 2c.

The remaining course of the process, the result of which is illustrated in FIG. 2d, takes place completely analogously to the course of the process that has already been described thoroughly in connection with FIG. 1i.

The second embodiment involves, in particular, preventing the gate dielectric from running over pointed edges of the silicon in the lower region of the STI oxide filling.

Although the present invention has been described with regard to preferred embodiments, it is not restricted thereto, but rather can be modified in various ways which appear clear to the person skilled in the art.

In particular, the selection of the materials is only an example and can be varied diversely.

In particular, it is possible to use a different gate dielectric instead of ONO. The SONOS-like transistors, floating gate transistors and logic transistors can thus be produced according to the invention.

| List of Reference Symbols | |
| --- | --- |
| 100 | SOI substrate |
| 106 | Carrier substrate |
| 108 | Oxide layer |
| 1 | Active silicon layer |
| 30 | Pad oxide layer |
| 50 | Pad nitride layer |
| 113, 113a, 113a', 113b, 113b', 113b" | Channel regions |
| 114 | Source region |
| 116 | Drain region |
| 118, 120 | Contacts |
| 122 | Gate region |
| Ga-Ge, Ga'-Ge' | STI trenches |
| D1 | Residual thickness |
| S1-S4, S1'-S4' | Hard mask regions |
| 9 | STI oxide filling |
| H' | Residual height |
| H" | Height of the gap regions |
| U1-U5 | Gap regions |

The invention claimed is:

1. FinFET transistor arrangement comprising:
a substrate (106, 108);
an active region (1) on the substrate, said active region having a source region (114), a drain region (116) and an intervening fin-like channel region (113*b*'; 113*b*") for each individual FinFET transistor;
a gate dielectric (11) and a gate region (13, 14, 15) over the fin-like channel region (113*b*'; 113*b*") for each individual FinFET transistor;
a respective region with an STI oxide filling (9), which reaches as far as above the underside of the fin-like channel regions (113*b*':113*b*') over which region the gate dielectric (11) and the gate region (13, 14, 15) run, being provided between adjacent fin-like channel regions (113*b*'; 113*b*") in the active region (1); and
a gap region (U1-U5) filled with an insulating filling (17) being provided between the respective fin-like channel region (113*b*") and the STI oxide filling (9), wherein only the gap region (U1-U5) is filled with the insulating filling (17).

* * * * *